United States Patent
Abeln et al.

(10) Patent No.: US 7,440,313 B2
(45) Date of Patent: Oct. 21, 2008

(54) TWO-PORT SRAM HAVING IMPROVED WRITE OPERATION

(75) Inventors: Glenn C. Abeln, Austin, TX (US); James D. Burnett, Meylan (FR); Lawrence N. Herr, Coupland, TX (US); Jack M. Higman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/561,206

(22) Filed: Nov. 17, 2006

(65) Prior Publication Data

US 2008/0117665 A1    May 22, 2008

(51) Int. Cl.
    *G11C 11/00*    (2006.01)
(52) U.S. Cl. .................. 365/154; 365/226; 365/156
(58) Field of Classification Search ................. 365/154, 365/227, 188, 156, 226
See application file for complete search history.

(56) References Cited

U.S. PATENT DOCUMENTS

| | | | |
|---|---|---|---|
| 5,132,929 A * | 7/1992 | Ochii | ................. 365/201 |
| 5,453,950 A | 9/1995 | Voss et al. | |
| 6,205,049 B1 | 3/2001 | Lien et al. | |
| 6,222,777 B1 * | 4/2001 | Khieu | ................. 365/189.02 |
| 6,459,611 B2 | 10/2002 | Rimondi | |
| 6,552,923 B2 * | 4/2003 | Houston | ................. 365/154 |
| 7,239,558 B1 * | 7/2007 | Poplevine et al. | ........... 365/188 |
| 2006/0104107 A1 * | 5/2006 | Remington et al. | ......... 365/154 |
| 2007/0171713 A1 * | 7/2007 | Hunter et al. | ........... 365/185.07 |

OTHER PUBLICATIONS

Tran; "Demonstration of 5T SRAM and 6T Dual-Port RAM Cell Arrays" 1996 Symposium on VLSI Circuits Digest of technical Papers, IEEE.
International Search Report for coordinating PCT Application No. PCT/US07/79709 mailed May 28, 2008.

* cited by examiner

*Primary Examiner*—Huan Hoang
(74) *Attorney, Agent, or Firm*—Daniel D. Hill; Ranjeev K. Singh

(57) ABSTRACT

A two-port SRAM memory cell includes a pair of cross-coupled inverters coupled to storage nodes. An access transistor is coupled between each storage node and a write bit line and controlled by a write word line. The write word line is also coupled to a power supply terminal of the pair of cross-coupled inverters. During a write operation, the write word line is asserted. A voltage at the power supply terminal of the cross-coupled inverters follows the write word line voltage, thus making it easier for the stored logic state at the storage nodes to change, if necessary. At the end of the write operation, the write word line is de-asserted, allowing the cross-coupled inverters to function normally and hold the logic state of the storage node. Coupling the power supply node of the cross-coupled inverters allows faster write operations without harming cell stability.

20 Claims, 3 Drawing Sheets

TWO-PORT SRAM HAVING IMPROVED WRITE OPERATION

FIELD OF THE INVENTION

The present invention relates generally to memories, and more particularly, to a static random access (SRAM) memory having an improved write operation.

BACKGROUND OF THE INVENTION

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft errors, and power supply fluctuations which may cause the cell to inadvertently change logic states. Also, the SRAM cell should ideally provide good stability during read operations without harming speed or the ability to write to the cell.

A two-port SRAM cell has a write word line and a read word line. A read port of the SRAM cell may include a pair of series-connected MOS (metal-oxide semiconductor) transistors coupled between a power supply terminal and a read bit line. A gate of one transistor is coupled to a storage node of the cell and the gate of the other transistor is connected to the read word line. Using a separate read port in this manner provides the advantage of having little or no adverse effect on cell stability or the write margin.

Low voltage operation is becoming more common for SRAM in portable applications. Today, power supply voltages for an active memory cycle may be in the range of one volt or less. Providing a low voltage SRAM with adequate write margins and with good cell stability may be difficult and usually comes at the expense of lower read and write performance.

Therefore, there is a need for a SRAM having improved write margins at low power supply voltages without decreasing cell stability.

BRIEF DESCRIPTION OF THE DRAWINGS

The present invention is illustrated by way of example, and not by way of limitation, in the figures of the accompanying drawings and in which like reference numerals refer to like elements and in which.

DETAILED DESCRIPTION

Figure 1:
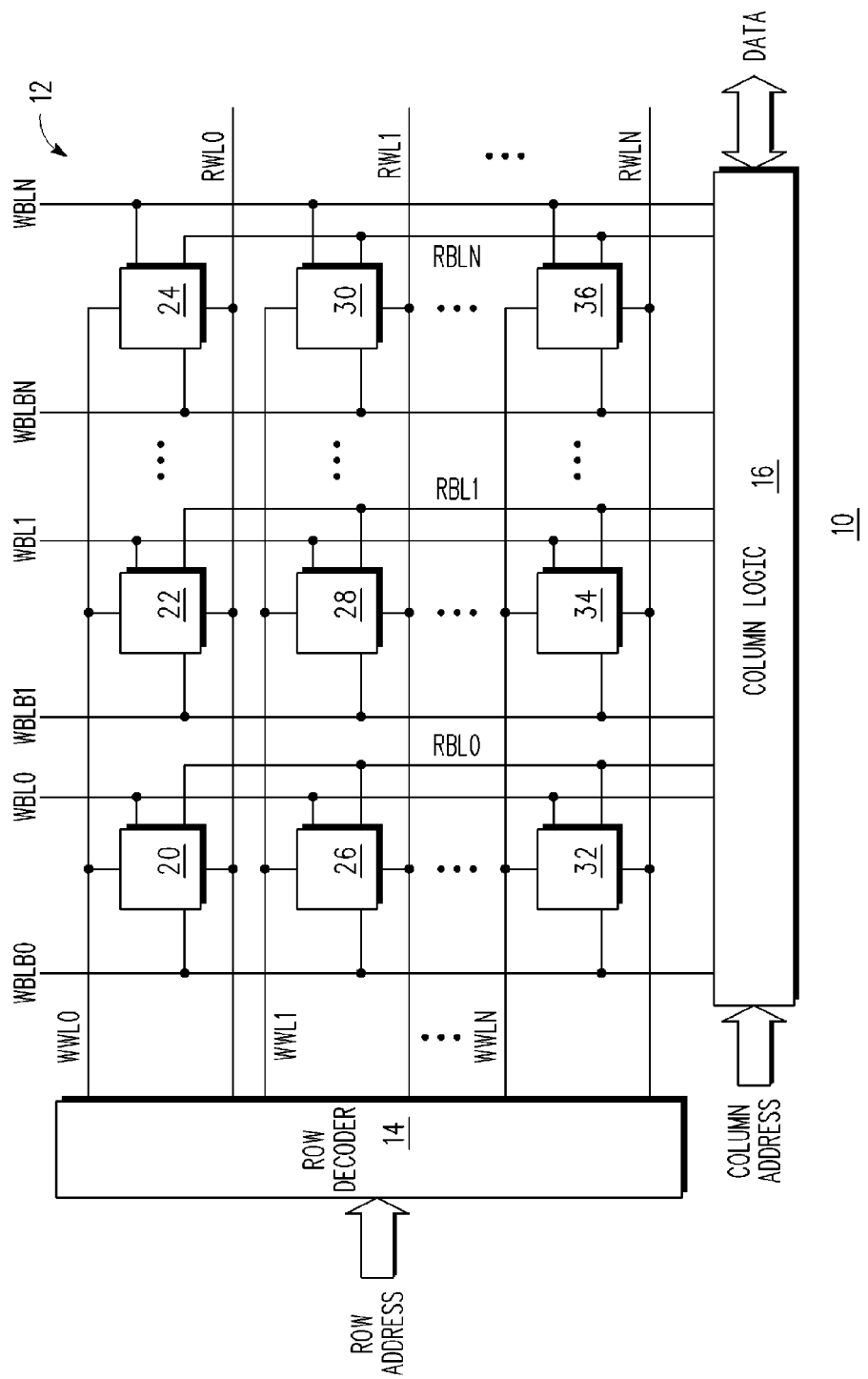
FIG. 1 illustrates, in block diagram form, a two-port integrated circuit memory in accordance with an embodiment of the present invention.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Generally, the present invention provides, in one form, a two-port SRAM memory cell having faster write operations without harming cell stability. In one embodiment, the two-port memory cell includes a pair of cross-coupled inverters coupled to storage nodes. An access transistor is coupled between each storage node and a write bit line and controlled by a write word line. The write word line is also coupled to a power supply terminal of the pair of cross-coupled inverters. During a write operation, the write word line is asserted and transitions from a logic low voltage (ground) to a logic high voltage. A voltage at the power supply terminal of the cross-coupled inverters is raised with the write word line voltage, thus making it easier for the stored logic state at the storage node to change, if necessary. At the end of the write operation, the write word line voltage is reduced to ground potential allowing the cross-coupled inverters to function normally and hold the logic state of the storage node.

The illustrated embodiment provides a two-port memory with the advantage of faster write operations at a lower power supply voltage than the write operations of a standard memory cell, where the standard memory cell has power supply voltage terminals coupled to receive a continuous power supply voltage. Also, the illustrated embodiment provides a two-port memory having the advantage of faster write operations without reducing cell stability.

In one aspect of the present invention, a memory cell is coupled to a word line. The memory cell comprises a pair of cross-coupled inverters having a first power supply terminal for receiving a first power supply voltage and a second power supply terminal for receiving a second power supply voltage. The second power supply terminal is connected to the word line.

In another aspect of the present invention, a memory cell is coupled to a word line, the memory cell comprising: a first access transistor coupled to a first storage node and a second access transistor coupled to a second storage node; at least one read port coupled to at least one of the first storage node and the second storage node; a pair of cross-coupled inverters having a first power supply terminal for receiving a first power supply voltage and a second power supply terminal for receiving a second power supply voltage. The second power supply terminal is connected to the word line. The pair of cross-coupled inverters comprise: a first inverter having an input terminal coupled to the first storage node and an output terminal, and a second inverter having an input terminal coupled to the output terminal of the first inverter and an output terminal coupled to the input terminal of the first inverter at the first storage node.

In yet another aspect of the present invention, a method for accessing a memory is provided. The memory comprises at least one memory cell coupled to a word line. The at least one memory cell comprises a pair of cross-coupled inverters having a first power supply terminal for receiving a first power supply voltage and a second power supply terminal for receiving a second power supply voltage. The method comprises enabling a receipt of a signal on the word line to write a bit for storage into the at least one memory cell, wherein the word line is directly connected to the second power supply terminal.

FIG. 1 illustrates, in block diagram form, a two-port integrated circuit memory 10 in accordance with an embodiment of the present invention. Generally, memory 10 includes a plurality of memory cells 12, a row decoder 14, and column logic 16. The plurality of memory cells 12 includes representative memory cells 20, 22, 24, 26, 28, 30, 32, 34, and 36. As illustrated in FIG. 1, each of the memory cells is coupled to one of a plurality of write word lines labeled "WWL0" to "WWLN", to one pair of a plurality of pairs of write bit lines labeled "WBL0/WBLB0" to "WBLN/WBLBN", to one of a plurality of read word lines labeled "RWL0"-"RWLN", and to one of a plurality of read bit lines labeled "RBL0" to "RBLN". The plurality of memory cells 12 are implemented in rows and columns. For example, memory cells 20, 22, and 24 and the word line WWL0 form one row of memory cells. Likewise, memory cells 20, 26, and 32 form one column of memory cells.

The row decoder 14 has an input for receiving a row address labeled "ROW ADDRESS", and a plurality of output terminals coupled to the plurality of write word lines WWL0 to WWLN. The read word lines RWL0-RWLN are coupled to row decoder 14. The column logic 16 has an input terminal for receiving a column address labeled "COLUMN ADDRESS", a first plurality of terminals coupled to write bit line pairs WBL0/WBLB0-WBLN/WBLBN, a second plurality of terminals coupled to read bit line pairs RBL0-RBLN, and a plurality of input/output (I/O) terminals for receiving or providing data signals labeled "DATA". As illustrated in FIG. 1, the read bit lines, write bit lines, and column select lines run in the column direction, and the write word lines and read word lines run in the row direction. Column logic 16 includes, for example, column decoders, sense amplifiers, bit line equalization and precharge circuits, and buffer circuits. Note that in the illustrated embodiment, the sense amplifiers for a read operation are single-ended. In another embodiment not illustrated in FIG. 1, the sense amplifiers may be differential.

In one embodiment, memory 10 is implemented as a cache memory in an integrated circuit data processor. In another embodiment, memory 10 may be a stand-alone integrated circuit memory. The column decoders of column logic 16 select which of the memory cells are to receive or provide data. Note that during a write access to the memory 10, all of the memory cells coupled to a selected one of write word lines WWL0 to WWLN are enabled to receive data signals from the bit lines. This is because asserting a write word line in the illustrated embodiment disturbs the stored states of all of the memory cells coupled to the write word line. Therefore, an entire row is written during each write operation. In a memory used to store instructions and/or data for use by a processor, it is common for the memory to be organized such that the number of columns is equal to a "cache line". A number of bits equal to the cache line width are accessed during each memory operation. In the illustrated embodiment, the address signals COLUMN ADDRESS determines which memory cells of a row are selected to provide data during a read operation.

Figure 2:
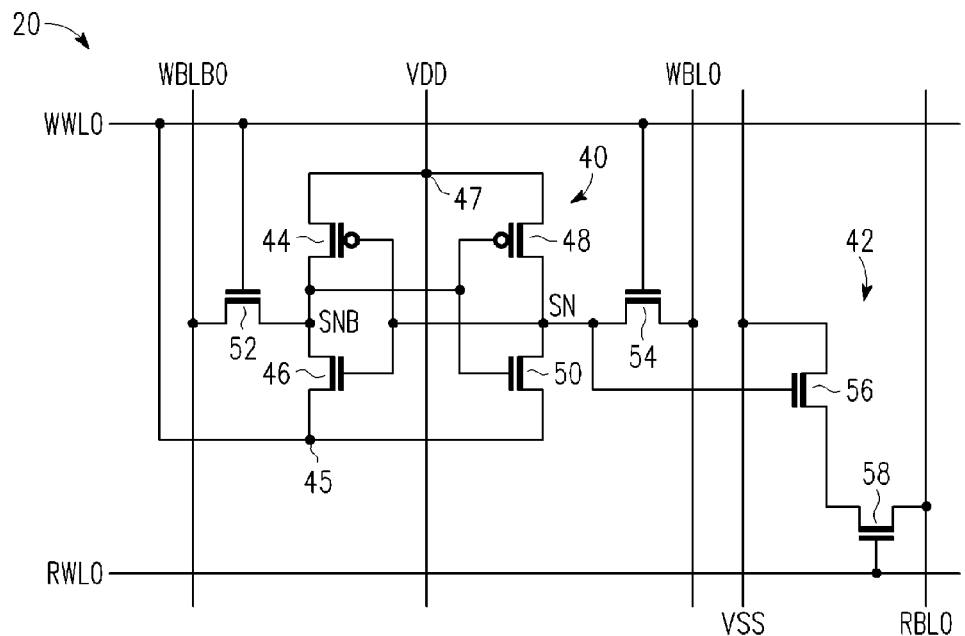
FIG. 2 illustrates, in schematic diagram form, one embodiment of a memory cell of the memory of FIG. 1.

FIG. 2 illustrates, in schematic diagram form, an 8-transistor (8-T) memory cell 20 of the memory of FIG. 1. Memory cell 20 is implemented on an integrated circuit using CMOS (complementary metal-oxide semiconductor) transistors. Memory cell 20 includes a pair of cross-coupled inverters 40, a read port 42, and access transistors 52 and 54. Cross-coupled inverters 40 includes one inverter having P-channel transistor 44 and N-channel transistor 46, and another inverter having P-channel transistor 48 and N-channel transistor 50. Read port 42 includes N-channel transistors 56 and 58.

In memory cell 20, P-channel transistor 44 has a source (current electrode) connected to a power supply conductor labeled "VDD" at a power supply node 47, a drain (current electrode) connected to a storage node labeled "SNB", and a gate (control electrode) connected to a storage node labeled "SN". Power supply conductor VDD is routed over the plurality of memory cells 12 to supply power to the cells. N-channel transistor 46 has a drain connected to the drain of P-channel transistor 44, a source connected to a write word line labeled "WWL0" at a power supply node 45, and a gate connected to the gate of P-channel transistor 44. P-channel transistor 48 has a source connected to VDD, a drain connected to storage node SN, and a gate connected to storage node SNB. Node that a letter "B" after a signal name indicates that the signal name is a logical complement of a signal having the same name but lacking the "B". N-channel transistor 50 has a drain connected to storage node SN, a source connected to write word line WWL0, and a gate connected to the gate of P-channel transistor 48. N-channel transistor 52 has a drain/source terminal connected to a write bit line labeled "WBLB0", a drain/source terminal connected to storage node SNB, and a gate connected to write word line WWL0. N-channel transistor 54 has a drain/source terminal connected to storage node SN, a drain/source terminal connected to write bit line WBL0, and a gate connected to storage node SN.

In read port 42, N-channel transistor 56 has a first drain/source terminal connected to a power supply voltage conductor labeled "VSS", a second drain/source terminal, and a gate connected to storage node SN. Power supply conductor VSS is routed over the plurality of memory cells 12 to provide the memory cells with a ground connection. N-channel transistor 58 has a first drain/source terminal connected to the first drain/source terminal of transistor 56, a second drain/source terminal connected to a read bit line labeled "RBL0", and a gate connected to a read word line labeled "RWL0".

In the illustrated embodiment, power supply voltage VDD is a positive power supply voltage, for example one volt, and power supply voltage VSS is ground. In another embodiment, the power supply voltages may be different. For example, VDD may be ground and VSS may be a negative voltage.

Figure 3:
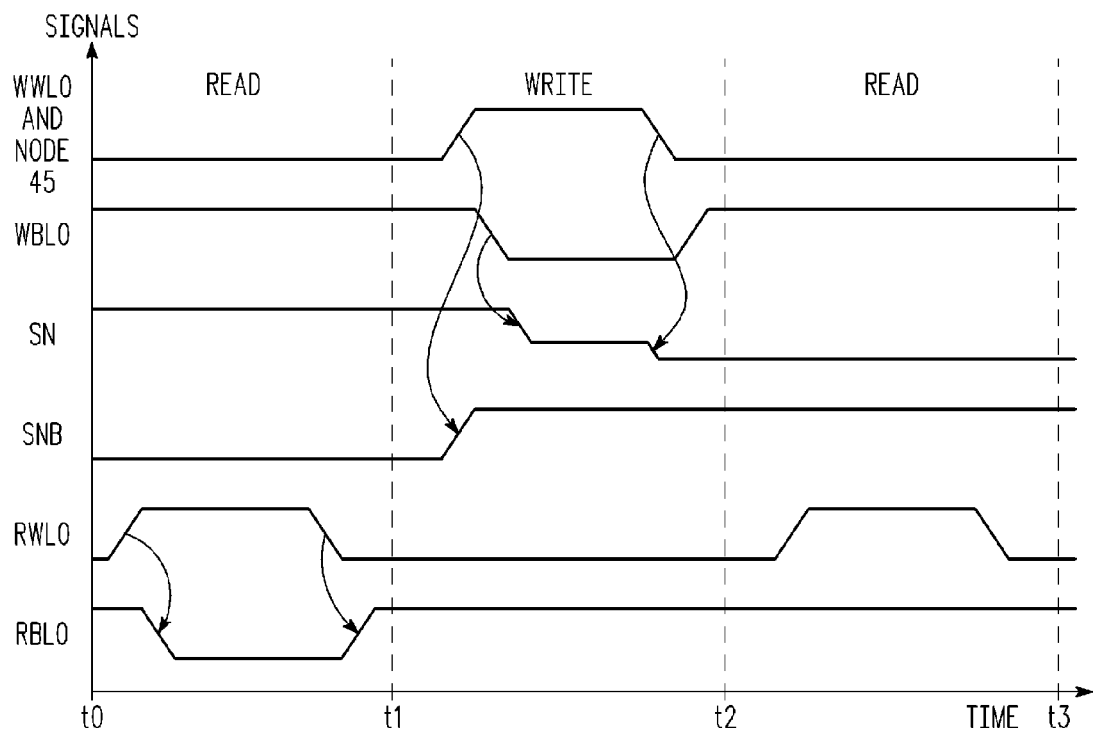
FIG. 3 illustrates a timing diagram of various signals of the memory cell of FIG. 2.

FIG. 3 illustrates a timing diagram of various signals of the memory cell of FIG. 2 versus time. Read and write operations of memory cell 20 will be discussed with reference to FIG. 1, FIG. 2, and FIG. 3. Note that in the illustrated embodiment, a "logic high" voltage is a positive voltage and a "logic low" voltage is equal to about ground potential. In other embodiments, the voltages may be different.

As illustrated in FIG. 3, a read operation begins at time t0 and ends at time t1. At time t0, the write word line WWL0 is a logic low, allowing the pair of cross-coupled inverters 40 to maintain the logic state of the storage nodes SN/SNB. Conversely, storage node SN is being maintained as a logic high voltage. The read bit line RBL0 is precharged to a logic high. In another embodiment, the read bit lines may be precharged to ground or to an intermediate voltage. Just after time t0, row decoder 14 asserts read word line RWL0 as a logic high causing N-channel transistor 58 to become conductive. N-channel transistor 56 is already conductive because storage node SN is storing a logic high. Transistors 56 and 58 cause the logic high precharge voltage on the read bit line RBL0 to be reduced to a logic low. The logic low voltage is provided to a sense amplifier of column logic 16 and is then outputted as a bit of DATA. After a predetermined amount of time, the read operation ends with read word line RWL0 returning to a logic low potential. The logic low of read word line RWL0 causes transistor 58 to become substantially non-conductive, allowing bit line precharge circuitry of column logic 16 to return the potential of read bit line RBL0 to a logic high in preparation for another read operation.

A write operation to memory cell 20 occurs between times t1 and t2. Prior to the write operation, memory cell 20 is storing a logic high as illustrated in FIG. 3 by storage nodes SN and SNB being a logic high and a logic low, respectively. Also, prior to the write operation, write bit line WBL0 is precharged to a logic high by precharge circuitry of column logic 16 and write word line WWL0 is de-asserted as a logic low. To begin the write operation, write word line WWL0 is asserted as a logic high by row decoder 14 as illustrated in FIG. 3. The logic high write word line WWL0 causes access transistors 52 and 54 to be conductive, coupling storage node SN to write bit line WBL0 and storage node SNB to write bit line WBLB0. Also, the voltage at power supply node 45 is raised to substantially the same voltage as the asserted write word line WWL0, causing the voltage at both storage nodes SN and SNB to initially increase to near a logic high. A logic low voltage is to be written to memory cell 20, as indicated by write bit line WBL0 being reduced to a logic low after the write word line is asserted. The logic state of write bit line WBL0 is provided to storage node SN via access transistor 54. Also, because differential write bit lines are used, write bit line WBLB0 is provided to storage node SNB via transistor 52 (not illustrated in FIG. 3). The logic low voltage of write bit line WBL0 causes the voltage of storage node SN to be reduced below the voltage of storage node SNB to a voltage low enough such that when the write word line WWL0 is de-asserted, the storage node will be reduced to logic low. The write word line WWL0 is then de-asserted causing the voltage at power supply node 45 to be reduced to about ground potential, and causing access transistors 52 and 54 to become substantially non-conductive. The inverters of the pair of cross-coupled inverters 40 begin to function and the bistable nature of the cross-coupled pair causes the voltage of storage node SN be reduced to a logic low and the voltage of SNB to increase to a logic high. The write bit lines WBL0 and WBLB0 are precharged in preparation for another write operation. The write operation ends at time t2.

Still referring to FIG. 3, another read operation occurs between times t2 and t3. The read operation begins with the assertion of read word line RWL0. Storage nodes SN and SNB are storing a logic low and a logic high, respectively. The asserted read word line RWL0 causes N-channel transistor 58 to be conductive. Because storage node SN is at a logic low, N-channel transistor 56 remains substantially non-conductive. Read bit line RBL0 is not coupled to power supply conductor VSS and the logic high voltage of read bit line RBL0 is sensed and amplified by a sense amplifier of column logic 16. At time t3, the memory cell is ready for another read or write operation.

Figure 4:
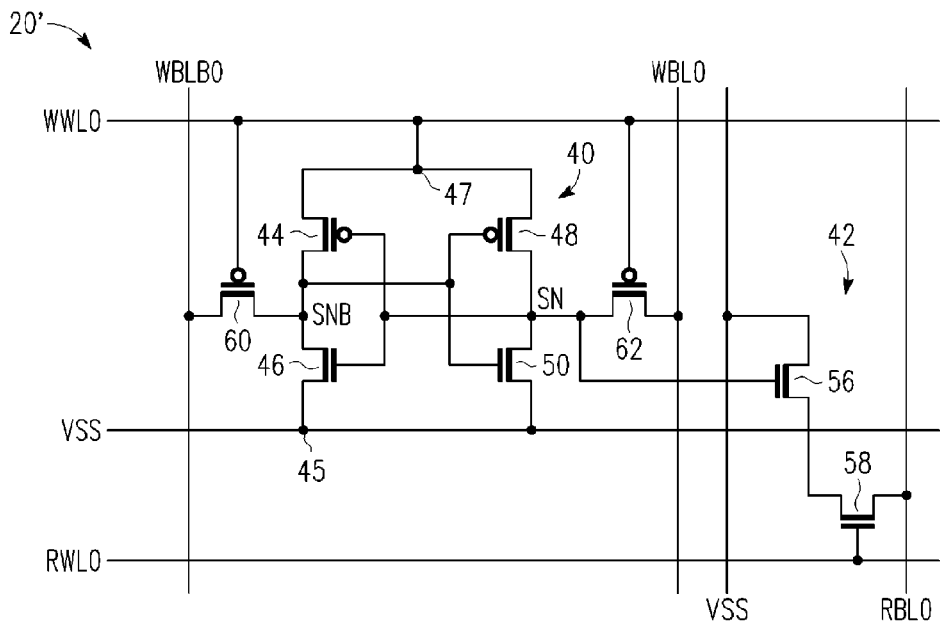
FIG. 4 illustrates, in schematic diagram form, another embodiment of a memory cell of the memory of FIG. 1.

FIG. 4 illustrates, in schematic diagram form, a memory cell 20' of the memory of FIG. 1. Memory cell 20' is implemented on an integrated circuit using CMOS (complementary metal-oxide semiconductor) transistors. Memory cell 20' differs from memory cell 20 in that the access transistors are implemented as P-channel transistors 60 and 62. Also, memory cell 20' differs in that the write word line WWL0 is coupled to power supply node 47 instead of to power supply node 45. In addition, the power supply conductor VDD is not necessary in the embodiment of FIG. 4.

Figure 5:
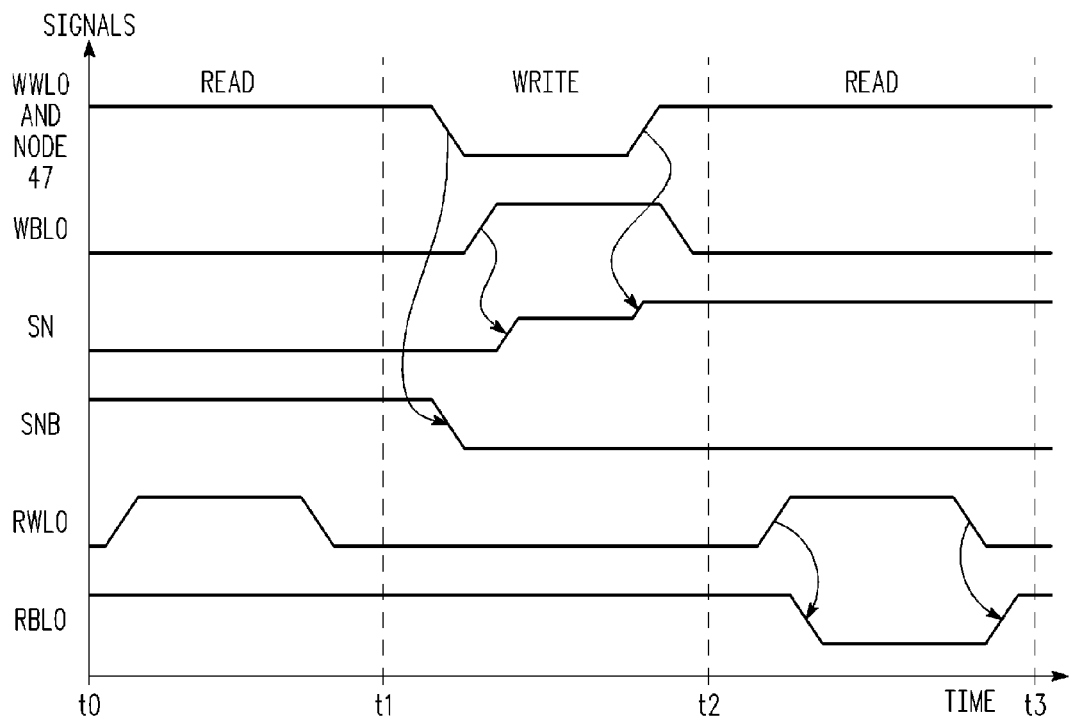
FIG. 5 illustrates a timing diagram of various signals of the memory cell of FIG. 4.

FIG. 5 illustrates a timing diagram of various signals of the memory cell of FIG. 4. Read and write operations of memory cell 20' will be discussed referring to FIG. 1, FIG. 4, and FIG. 5.

As illustrated in FIG. 5, a read operation begins at time t0 and ends at time t1. At time t0, the write word line WWL0 is a logic high causing P-channel access transistors 60 and 62 to be substantially non-conductive, thus allowing the pair of cross-coupled inverters 40 to maintain the logic state of the storage nodes SN/SNB. Storage node SN is being maintained as a logic low voltage. The read bit line RBL0 is precharged to a logic high. In another embodiment, the read bit lines may be precharged to ground or to an intermediate voltage. Just after time t0, row decoder 14 asserts read word line RWL0 as a logic high causing N-channel transistor 58 to become conductive. N-channel transistor 56 is substantially non-conductive because storage node SN is storing a logic low. The read bit line RBL0 is read by column logic 16 as a logic high. The logic high is provided to a sense amplifier of column logic 16 and is then outputted as a bit of DATA. After a predetermined amount of time, the read operation ends with read word line RWL0 returning to a logic low potential. The logic low of read word line RWL0 causes transistor 58 to become substantially non-conductive, allowing bit line precharge circuitry of column logic 16 to return the potential of read bit line RBL0 to a logic high, if necessary, in preparation for another read operation.

A write operation to memory cell 20' occurs between times t1 and t2. Prior to the write operation, memory cell 20' is storing a logic low as indicated by storage nodes SN and SNB being a logic low and a logic high, respectively. Also, prior to the write operation, write bit line WBL0 is precharged to a logic low voltage by precharge circuitry of column logic 16, and write word line WWL0 is de-asserted as a logic high. To begin the write operation, write word line WWL0 is asserted as a logic low by row decoder 14 as illustrated in FIG. 5. The logic low write word line WWL0 causes access transistors 60 and 62 to be conductive, coupling storage node SN to write bit line WBL0 and storage node SNB to write bit line WBLB0. Also, the voltage at power supply node 47 is lowered to substantially the same voltage as the asserted write word line WWL0, causing the voltage at both storage nodes SN and SNB to initially decrease to near a logic low. A logic high voltage is to be written to memory cell 20', as indicated by write bit line WBL0 being increased to a logic high after the write word line WWL0 is asserted. The logic state of write bit line WBL0 is provided to storage node SN via access transistor 62. Also, because differential write bit lines are used, write bit line WBLB0 is provided to storage node SNB via transistor 60 (not illustrated in FIG. 5). The logic high voltage of write bit line WBL0 causes the voltage of storage node SN to be increased above the voltage of storage node SNB to a voltage high enough that when the write word line WWL0 is de-asserted, the voltage of the storage node SN will be increased to logic high. The write word line WWL0 is then de-asserted causing the voltage at power supply node 47 to be increase to VDD, and causing access transistors 60 and 62 to become substantially non-conductive. The inverters of the pair of cross-coupled inverters 40 begin to function and the bistable nature of the cross-coupled pair causes the voltage of storage node SN be increased to a logic high and the voltage of SNB to decrease to a logic low. The write bit lines WBL0 and WBLB0 are both precharged in preparation for another write operation just prior to time t2. The write operation ends at time t2.

Still referring to FIG. 5, another read operation occurs between times t2 and t3. The read operation begins with the assertion of read word line RWL0. Storage nodes SN and SNB are storing a logic high and a logic low, respectively, before the read operation. The asserted read word line RWL0 causes N-channel transistor 58 to be conductive. Because storage node SN is at a logic high, N-channel transistor 56 becomes conductive. Read bit line RBL0 is coupled to power supply conductor VSS via transistors 56 and 58 and the read bit line RBL0 is reduced to the voltage of VSS (ground). The logic low voltage of read bit line RBL0 is sensed and amplified by a sense amplifier of column logic 16. At time t3, the memory cell is ready for another read or write operation.

While the invention has been described in the context of a preferred embodiment, it will be apparent to those skilled in the art that the present invention may be modified in numerous ways and may assume many embodiments other than that specifically set out and described above.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The term "coupled", as used herein, is defined as connected, although not necessarily directly, and not necessarily mechanically. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory cell coupled to a word line, comprising:
a pair of cross-coupled inverters having a first power supply terminal for receiving a first power supply voltage and a second power supply terminal connected to the word line, wherein the second power supply terminal is for receiving the first power supply voltage from the word line when the pair of cross-coupled inverters is accessed during a write operation of the memory cell, and wherein the second power supply terminal is for receiving a second power supply voltage from the word line when the pair of cross-coupled inverters are not being accessed for the write operation, the second power supply voltage being different from the first power supply voltage.

2. The memory cell of claim 1, wherein the pair of cross-coupled inverters comprises:
a first inverter having an input terminal coupled to a first storage node and an output terminal, and
a second inverter having an input terminal coupled to the output terminal of the first inverter and an output terminal coupled to the input terminal of the first inverter at the first storage node.

3. The memory cell of claim 1 further comprising a first access transistor coupled to the first storage node and a second access transistor coupled to the second storage node.

4. The memory cell of claim 3 further comprising at least one read port coupled to at least one of the first storage node and the second storage node, wherein the at least one read port comprises:
a first transistor having a first current electrode coupled to a ground terminal, a control electrode coupled to the first storage node, and a second current electrode; and
a second transistor having a first current electrode coupled to the second current electrode of the first transistor, a control electrode coupled to a read word line, and a second current electrode coupled to a read bit line.

5. The memory cell of claim 2, wherein the first inverter comprises:
a first transistor having a first current electrode coupled to the first power supply voltage terminal, a control electrode coupled to the first storage node, and a second current electrode coupled to the second storage node; and
a second transistor having a first current electrode coupled to the second current electrode of the first transistor, a control electrode coupled to the control electrode of the first transistor, and a second current electrode coupled to the second power supply terminal.

6. The memory cell of claim 5, wherein the second inverter comprises:
a third transistor having a first current electrode coupled to the first power supply voltage terminal, a control electrode coupled to the second storage node, and a second current electrode coupled to the first storage node; and
a fourth transistor having a first current electrode coupled to the second current electrode of the third transistor, a control electrode coupled to the control electrode of the third transistor, and a second current electrode coupled to the second power supply voltage terminal.

7. The memory cell of claim 3, wherein each of the first access transistor and the second access transistor is a p-channel transistor.

8. The memory cell of claim 3, wherein each of the first access transistor and the second access transistor is an n-channel transistor.

9. A memory comprising the memory cell of claim 1.

10. A memory cell, comprising:
a first access transistor coupled to a first storage node and a second access transistor coupled to a second storage node, and control electrodes of the first and second access transistors connected to a word line;
at least one read port coupled to at least one of the first storage node and the second storage; and
a pair of cross-coupled inverters having a first power supply terminal for receiving a first power supply voltage and a second power supply terminal connected to the word line, wherein the second power supply terminal receives the first power supply voltage from the word line during a write operation to the pair of cross-coupled inverters and receives a second power supply voltage that is different from the first power supply voltage during a read operation of the pair of cross-coupled inverters, and wherein the pair of cross-coupled inverters comprises:
a first inverter having an input terminal coupled to the first storage node and an output terminal, and
a second inverter having an input terminal coupled to the output terminal of the first inverter and an output terminal coupled to the input terminal of the first inverter at the first storage node.

11. The memory cell of claim 10, wherein the at least one read port comprises:
- a first transistor having a first current electrode coupled to a ground terminal, a control electrode coupled to the first storage node, and a second current electrode; and
- a second transistor having a first current electrode coupled to the second current electrode of the first transistor, a control electrode coupled to a read word line, and a second current electrode coupled to a read bit line.

12. The memory cell of claim 10, wherein the first inverter comprises:
- a first transistor having a first current electrode coupled to the first power supply voltage terminal, a control electrode coupled to the first storage node, and a second current electrode coupled to the second storage node; and
- a second transistor having a first current electrode coupled to the second current electrode of the first transistor, a control electrode coupled to the control electrode of the first transistor, and a second current electrode coupled to the second power supply terminal.

13. The memory cell of claim 12, wherein the second inverter comprises:
- a third transistor having a first current electrode coupled to the first power supply voltage terminal, a control electrode coupled to the second storage node, and a second current electrode coupled to the first storage node; and
- a fourth transistor having a first current electrode coupled to the second current electrode of the third transistor, a control electrode coupled to the control electrode of the third transistor, and a second current electrode coupled to the second power supply voltage terminal.

14. The memory cell of claim 10, wherein each of the first access transistor and the second access transistor is a p-channel transistor.

15. The memory cell of claim 10, wherein each of the first access transistor and the second access transistor is an n-channel transistor.

16. A memory comprising at least the memory cell of claim 10.

17. A method for accessing a memory comprising at least one memory cell coupled to a word line, wherein the at least one memory cell comprises a pair of cross-coupled inverters having a first power supply terminal for receiving a first power supply voltage and a second power supply terminal, the method comprising:
- enabling a receipt of a signal on the word line to write a bit for storage into the at least one memory cell, wherein the word line is directly connected to the second power supply terminal for providing the first power supply voltage to the second power supply terminal; and
- disabling the signal on the word line when the at least one memory cell is not being written to, wherein the word line is for providing a second power supply voltage to the second power supply terminal, the second power supply voltage being different from the first power supply voltage.

18. The method of claim 17, wherein the at least one memory cell further comprises a first access transistor coupled to a first storage node and a second access transistor coupled to a second storage node.

19. The method of claim 17 further comprising enabling the at least one memory cell to perform a read operation or a data retention operation for a bit stored previously in the at least one memory cell.

20. The method of claim 19 further comprising enabling a faster write operation at a lower voltage to the at least one memory cell as compared to a write operation to a standard memory cell by coupling a voltage corresponding to the write signal to the second power supply terminal.

* * * * *